(12) United States Patent
Kawano et al.

(10) Patent No.: US 7,764,160 B2
(45) Date of Patent: Jul. 27, 2010

(54) VARIABLE-RESISTANCE ELEMENT

(75) Inventors: Hiroyasu Kawano, Kawasaki (JP); Keiji Shono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/352,441

(22) Filed: Jan. 12, 2009

(65) Prior Publication Data

US 2009/0121823 A1    May 14, 2009

Related U.S. Application Data

(63) Continuation of application No. PCT/JP2006/319289, filed on Sep. 28, 2006.

(51) Int. Cl.
H01C 7/10 (2006.01)
(52) U.S. Cl. .......................... 338/20; 338/13
(58) Field of Classification Search .................. 338/13, 338/20
See application file for complete search history.

(56) References Cited

U.S. PATENT DOCUMENTS

| | | | | |
|---|---|---|---|---|
| RE28,792 E | * | 4/1976 | Ruka et al. ................. 429/14 |
| 4,947,125 A | * | 8/1990 | De Pous .................... 324/459 |
| 5,880,406 A | * | 3/1999 | Gerstel et al. .............. 174/256 |
| 5,972,200 A | * | 10/1999 | Kim ........................ 205/784.5 |
| RE37,223 E | * | 6/2001 | Bose et al. ................. 381/102 |
| 7,060,586 B2 | | 6/2006 | Li et al. |
| 7,259,387 B2 | | 8/2007 | Kawazoe et al. |
| 7,307,270 B2 | | 12/2007 | Aratani et al. |
| 7,417,271 B2 | | 8/2008 | Genrikh et al. |
| 2005/0127524 A1 | | 6/2005 | Sakamoto et al. |
| 2005/0247921 A1 | | 11/2005 | Lee et al. |
| 2009/0218565 A1 | | 9/2009 | Kawano et al. |

FOREIGN PATENT DOCUMENTS

| | | |
|---|---|---|
| JP | A 2004-273615 | 9/2004 |
| JP | A 2004-281913 | 10/2004 |
| JP | A 2005-123361 | 5/2005 |
| JP | A 2005-203463 | 7/2005 |
| JP | A 2005-317976 | 11/2005 |
| JP | A 2005-328044 | 11/2005 |
| JP | A 2006-173627 | 6/2006 |
| JP | A 2007-88349 | 4/2007 |
| JP | A 2007-235139 | 9/2007 |
| WO | WO 03/094227 A1 | 11/2003 |

* cited by examiner

*Primary Examiner*—Kyung Lee
(74) *Attorney, Agent, or Firm*—Greer, Burns & Crain, Ltd.

(57) ABSTRACT

The invention provides a variable-resistance element having a multilayer structure. The variable-resistance element includes, for example, a first electrode, a second electrode, and an oxygen ion migration layer disposed between the first electrode and the second electrode. In the oxygen ion migration layer, oxygen vacancy can be produced owing to oxygen ion migration, thereby forming a low resistance path. The variable-resistance element also includes an oxygen ion generation promoting layer disposed between the oxygen ion migration layer and the first electrode and held in contact with the oxygen ion migration layer.

10 Claims, 10 Drawing Sheets

FIG.2
(a)
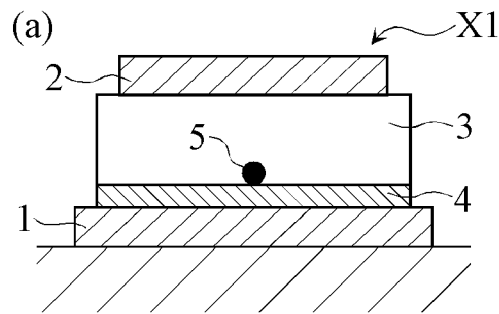
(b)
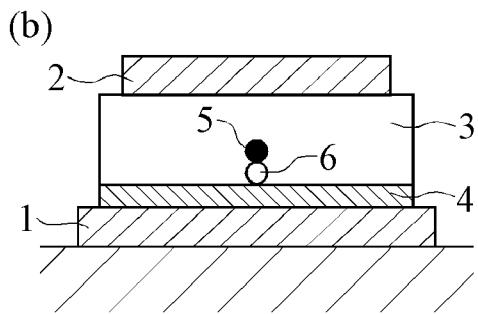
(c)
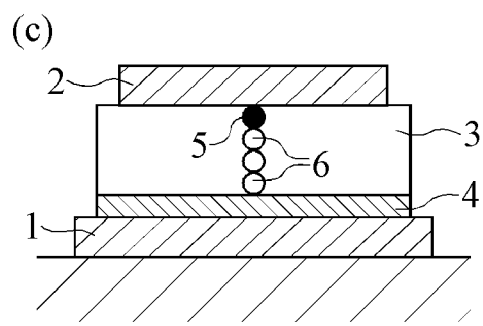
(d)
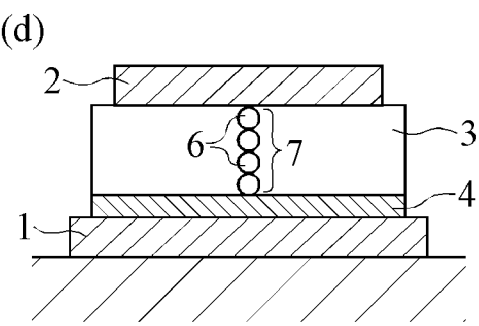
(e)
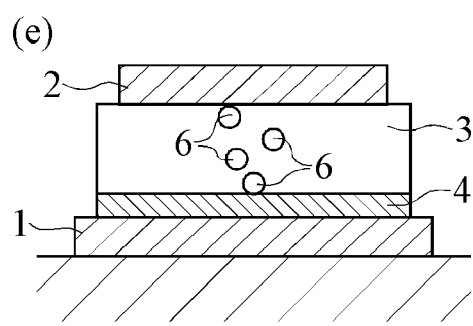
(f)
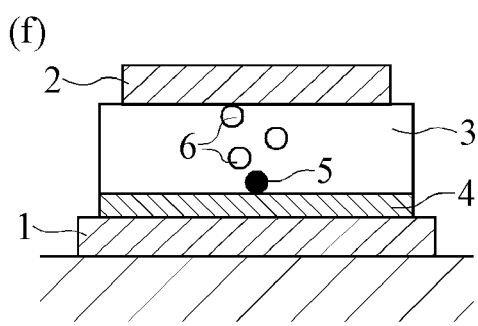
(g)
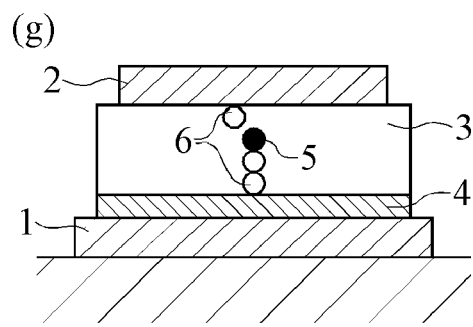
(h)
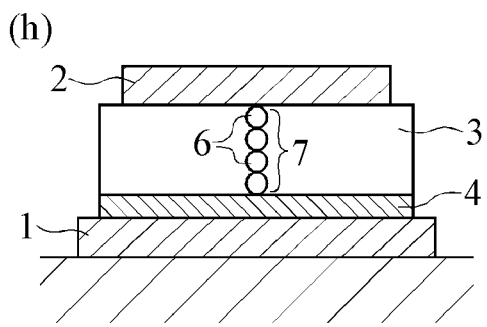

FIG.6

(a) Sample Element S1

| Electrode 2 | Pt (50nm) |
|---|---|
| Oxygen Ion Migration Layer 3 | Y-added $ZrO_2$ (Crystalline Material, 40nm) |
| Oxygen Ion Generation Promoting Layer 4 | $Y_2O_3$ Containing 20at% of Pt (2nm) |
| Electrode 1 | Pt (50nm) |
| Substrate S | MgO |

(b) Sample Element S6

| Electrode 2 | Pt (50nm) |
|---|---|
| Oxygen Ion Migration Layer 3 | Y-added $ZrO_2$ (Crystalline Material, 35nm) |
| | Y-added $ZrO_2$ (Crystalline Material, Containing $^{18}O$, 5nm) |
| Oxygen Ion Generation Promoting Layer 4 | $Y_2O_3$ Containing 20at% of Pt (2nm) |
| Electrode 1 | Pt (50nm) |
| Substrate S | MgO |

FIG.7

(a) Sample Element S2

| Electrode 2 | Pt (50nm) |
|---|---|
| Oxygen Ion Migration Layer 3 | Y-added $ZrO_2$ (Crystalline Material, 40nm) |
| Pseudo Oxygen Ion Generation Promoting Layer 4 | $Y_2O_3$ (2nm) |
| Electrode 1 | Pt (50nm) |
| Substrate S | MgO |

(b) Sample Element S7

| Electrode 2 | Pt (50nm) |
|---|---|
| Oxygen Ion Migration Layer 3 | Y-added $ZrO_2$ (Crystalline Material, 35nm) |
| | Y-added $ZrO_2$ (Crystalline Material, Containing $^{18}O$, 5nm) |
| Pseudo Oxygen Ion Generation Promoting Layer 4 | $Y_2O_3$ (2nm) |
| Electrode 1 | Pt (50nm) |
| Substrate S | MgO |

Sample Element S3

| Electrode 2 | Pt (50nm) |
|---|---|
| Oxygen Ion Migration Layer 3 | Y-added ZrO$_2$ (Crystalline Material, 40nm) |
| Electrode 1 | Pt (50nm) |
| Substrate S | MgO |

(b)

Sample Element S8

| Electrode 2 | Pt (50nm) |
|---|---|
| Oxygen Ion Migration Layer 3 | Y-added ZrO$_2$ (Crystalline Material, 35nm) |
| | Y-added ZrO$_2$ (Crystalline Material, Containing $^{18}$O含, 5nm) |
| Electrode 1 | Pt (50nm) |
| Substrate S | MgO |

FIG.9

(a) Sample Element S4

| Electrode 2 | Pt (50nm) |
|---|---|
| Oxygen Ion Migration Layer 3 | Y-added ZrO$_2$ (Non-Crystalline Material, 40nm) |
| Oxygen Ion Generation Promoting Layer 4 | Y$_2$O$_3$ Containing 20at% of Pt (2nm) |
| Electrode 1 | Pt (50nm) |
| Substrate S | MgO |

(b) Sample Element S9

| Electrode 2 | Pt (50nm) |
|---|---|
| Oxygen Ion Migration Layer 3 | Y-added ZrO$_2$ (Non-Crystalline Material, 35nm) |
| | Y-added ZrO$_2$ (Non-Crystalline Material, Containing $^{18}$O含, 5nm) |
| Oxygen Ion Generation Promoting Layer 4 | Y$_2$O$_3$ Containing 20at% of Pt (2nm) |
| Electrode 1 | Pt (50nm) |
| Substrate S | MgO |

FIG.10

(a)
Sample Element S5

| Electrode 2 | Pt (50nm) |
| --- | --- |
| Pseudo Oxygen Ion Migration Layer | Al2O3 (Crystalline Material, 40nm) |
| Oxygen Ion Generation Promoting Layer 4 | Y2O3 Containing 20at% of Pt (2nm) |
| Electrode 1 | Pt (50nm) |
| Substrate S | MgO |

(b)
Sample Element S10

| Electrode 2 | Pt (50nm) |
| --- | --- |
| Pseudo Oxygen Ion Migration Layer 3 | Al2O3 (Crystalline Material, 35nm) |
| | Al2O3 (Crystalline Material, Containing $^{18}O$, 5nm) |
| Oxygen Ion Generation Promoting Layer 4 | Y2O3 (2nm) |
| Electrode 1 | Pt (50nm) |
| Substrate S | MgO |

FIG.11

|  | Depth | | | | |
| --- | --- | --- | --- | --- | --- |
|  | 3nm | 10nm | 20nm | 30nm | 37nm |
| Sample Element S6 | ○ | ○ | ○ | ○ | ○ |
| Sample Element S7 | × | × | × | × | ○ |
| Sample Element S8 | × | × | ○ | ○ | ○ |
| Sample Element S9 | ○ | ○ | ○ | ○ | ○ |
| Sample Element S10 | × | × | × | × | ○ |

VARIABLE-RESISTANCE ELEMENT

This application is a Continuation of International Application No. PCT/JP2006/319289, filed Sep. 28, 2006.

TECHNICAL FIELD

The present invention relates to a variable-resistance element that can be switched between a high resistance state which makes it relatively difficult for a current to pass and a low resistance state which makes it relatively easy for a current to pass, and for example to a variable-resistance storage device that allows recording or rewriting data utilizing the switching the resistance state.

BACKGROUND ART

In the field of non-volatile memories, ReRAM (resistive RAM) is currently spotlighted. A ReRAM device is a kind of variable-resistance element, and generally includes a pair of electrodes and a recording film that can be selectively switched between the high resistance state and the low resistance state, according to a voltage applied between the pair of electrodes. ReRAM devices allow recording or rewriting data utilizing the selective switching of the resistance state of the recording film. The following patent documents 1 to 3 disclose such kind of ReRAM devices and variable-resistance elements.

Patent document 1: JP-A-2004-273615
Patent document 2: JP-A-2004-281913
Patent document 3: JP-A-2005-123361

ReRAM devices are broadly classified into a bipolar type and a unipolar type, from the viewpoint of electrical characteristics. In a bipolar ReRAM device, the direction of voltage application between the pair of electrodes for switching the recording film from the high resistance state to the low resistance state is different from the direction of voltage application between the pair of electrodes for switching the recording film from the low resistance state to the high resistance state. Accordingly, in a bipolar ReRAM device, the voltage of different polarities is employed when changing or switching the two types of resistance states. On the other hand, in a unipolar ReRAM device, the direction of voltage application between the pair of electrodes for switching the recording film from the high resistance state to the low resistance state is the same as the direction of voltage application between the pair of electrodes for switching the recording film from the low resistance state to the high resistance state. Accordingly, in a unipolar ReRAM device, the voltage of the same polarity is employed when changing the two types of resistance states. Since unipolar ReRAM devices allow applying the voltage of the same polarity when switching the two different resistance states (in other words, there is no need to change the polarity of the applied voltage when switching the two different resistance states) a unipolar ReRAM device is more advantageous compared with a bipolar ReRAM device, in that a unipolar ReRAM device facilitates avoiding complication of the device circuit including a ReRAM device.

Unipolar ReRAM devices including a recording film constituted of NiO, or a recording film constituted of $TiO_2$ have been reported. Regarding these ReRAM devices, however, although the fact that the unipolar-type operation is possible is known, the working principle has not been specified. Since the working principle is unclear, orientation for selection of materials for the parts of the ReRAM devices or for optimization of the design size cannot be established, which impedes the optimization in designing the ReRAM devices. Besides, presumably, employing different base materials for the recording film leads to a substantial change in working principle of the ReRAM device.

The present invention has been proposed under the above described situation, and it is therefore an object of the present invention to provide a variable-resistance element capable of performing a unipolar type operation under a predetermined working principle, and suitable for operating with a low voltage.

DISCLOSURE OF THE INVENTION

According to a first aspect of the present invention, there is provided a variable-resistance element having a multilayer structure. The variable-resistance element comprises: a first electrode; a second electrode; an oxygen ion migration layer disposed between the first electrode and the second element for providing a low resistance path of oxygen vacancy resulting from oxygen ion migration within the oxygen ion migration layer; and an oxygen ion generation promoter disposed between the oxygen ion migration layer and the first electrode and held in contact with the oxygen ion migration layer. In a preferred embodiment, the oxygen ion generation promoter may be constituted of a single layer.

With the above variable-resistance element, a low resistance state can be created by forming a low resistance path extending in the oxygen ion migration layer. Specifically, first, a maximum transmittable current value is set by putting a limit on the current to pass between the first electrode and the second electrode. Then, with the first electrode used as a negative one and the second electrode as a positive one, an increasing voltage is applied between the two electrodes, for example, from 0 V to a predetermined upper voltage not lower than a first threshold voltage. As a result, a low resistance path is formed within the oxygen ion migration layer, whereby the desired low resistance state is achieved. As the applied voltage is being increased up to or higher than the first threshold voltage, oxygen ions are produced at or in the vicinity of the boundary between the oxygen ion generation promoting layer and the oxygen ion migration layer. Then the generated oxygen ions carrying negative charge are caused to migrate in the oxygen ion migration layer toward the second electrode (positive electrode), to thereby form a path of oxygen vacancy in the oxygen ion migration layer, extending in a thickness-wise direction thereof as a trajectory of the oxygen ion migration (when the oxygen ions migrate in the oxygen ion migration layer, oxygen vacancies are sequentially formed where the oxygen ions have passed, or the migrating oxygen ions "attract" nearby oxygen vacancies and are substituted with them). Thus, a chain or a continuous row of oxygen vacancies can be formed in the oxygen ion migration layer in a manner such that it extends substantially through the entire thickness of the oxygen ion migration layer. The oxygen vacancy chain, having a lower resistance than where no oxygen vacancy chain is formed in the oxygen ion migration layer, provides a low resistance path penetrating through the oxygen ion migration layer in the thickness direction thereof. The resistance between the first and the second electrode becomes lower with such a low resistance path than without any. Once achieved, the low resistance state can remain even after the applied voltage has been reduced from the upper voltage down to lower than the first threshold voltage, e.g. to 0 V.

The above low resistance state of the variable-resistance element can be changed to the high resistance state in the following manner. Without putting any limit on the current value between the first electrode and the second electrode, an increasing voltage is applied between the first electrode (as the negative electrode) and the second electrode (as the positive electrode). The applied voltage is increased, for example, from 0 V up to a predetermined upper voltage not lower than a second threshold voltage (which is set to be lower than the first threshold voltage above). As a result, the high resistance state is achieved in the variable-resistance element. In the above voltage-increasing process, a gradually increasing current (whose ultimate value is set to be greater than the above maximum transmittable current, for example) is caused to flow from the second electrode to the first electrode, mainly through the low resistance path in the oxygen ion migration layer, generating Joule heat. Then, when the applied voltage exceeds the second threshold voltage, a sufficient amount of Joule heat is generated along the low resistance path and in its vicinity in the oxygen ion migration layer, thereby thermally diffusing the oxygen vacancies constituting the low resistance path for the low resistance state. (The thermal diffusion of the oxygen vacancies might be caused in part by the electric field produced between the two electrodes.) As a result, the low resistance path will vanish or at least partially be broken so that it loses continuity. This state is the high resistance state, in which no low resistance path extends through the thickness of the oxygen ion migration layer. Once achieved, the high resistance state can remain even after the applied voltage has been reduced from the upper voltage (no lower than the second threshold voltage) down to lower than the second threshold voltage, e.g. to 0 V. As readily understood, the thus achieved high resistance state can be switched back to the low resistance state by the above-described low resistance achieving process.

According to the present invention, as explained above, the variable-resistance element can be properly switched between the high resistance state (allowing less current to flow) and the low resistance state (allowing more current to flow) by the process of unipolar type (the polarity of voltage application between the pair of electrodes is the same for the high and low resistance). With the variable-resistance element thus configured, the selection of the resistance states enables recording or rewriting of information. This means that the variable-resistance element can be used as a variable-resistance type, non-volatile storage device. The variable-resistance element can also be utilized as a switching element in a circuit by the selective resistance change.

Further, the variable-resistance element of the present invention can operate with low voltage. As noted above, the oxygen ion generation promoter or promoting layer is held in contact with the oxygen ion migration layer at the side of the first electrode (negative electrode) for facilitating the generation of oxygen ions supposed to migrate in the oxygen ion migration layer. Accordingly, it is possible to reduce the voltage applied between the two electrodes for oxygen ion generation.

In summary, the variable-resistance element according to the first aspect of the present invention can operate as a unipolar type device with low voltage application.

According to a second aspect of the present invention, there is provided another multilayer type of variable-resistance element that comprises: a first electrode; a second electrode; and an oxygen ion migration layer for providing a low resistance path of oxygen vacancies to be formed by the migration of oxygen ions. The oxygen ion migration layer is disposed between the first electrode and the second electrode. The variable-resistance element of the second aspect further comprises a plurality of oxygen ion generation promoting layers, each of which is held in contact with the oxygen ion migration layer between the oxygen ion migration layer and the first electrode.

The variable-resistance element of the second aspect is provided, partially, with the same structure as the variable-resistance element of the first aspect, and is therefore capable of operating as a unipolar type device with low voltage application.

In addition, the variable-resistance element of the second aspect is capable of performing multi-value recording. In this variable-resistance element, as noted above, a plurality of oxygen ion generation promoting layers are provided between the first electrode (negative electrode) and the second electrode (positive electrode), and each oxygen ion generation promoting layer is held in contact with the oxygen ion migration layer at the side of the first electrode. Accordingly, for each of the oxygen ion generation promoting layers, one low resistance path can be formed to extend through the thickness of the oxygen ion migration layer. Depending on the number of the lower resistance paths to be formed (the number ranging from zero to the total number of all the promoting layers), different resistance states are selectively achievable. Thus, with the variable-resistance element, multi-value data recording or rewriting can be performed by switching between the different resistance states, ranging from the maximum resistance state with no low resistance path formed in the oxygen ion migration layer, to the minimum resistance state with all of the available low resistance paths formed correspondingly to the respective oxygen ion generation promoting layers.

In the first and the second aspect of the present invention, preferably the oxygen ion migration layer may be made of a solid electrolyte, which may be the same or similar material used for forming the electrolyte layer of a solid oxide fuel cell (SOFC).

Preferably, the oxygen ion migration layer (and the solid electrolyte) may be made of fluorite-structure type oxide or perovskite-structure type oxide. Examples of the fluorite-structure type oxide include: partially-stabilized zirconia ($ZrO_2$) containing Y, Ca, or Mg as an additive; $ZrO_2$; and $Y_2O_3$. Examples of the perovskite-structure type oxide include $SrTiO_3$ and $CaTiO_3$.

Preferably, the oxygen ion migration layer may be made of a crystalline material. The oxygen ion migration layer made of a crystalline material can exhibit better oxygen ion migration performance than when made of a non-crystalline material.

Preferably, the oxygen ion generation promoting layer may be made of an electroconductive oxide containing a precious metal. Preferably, the first electrode or the second electrode or both may be made of a precious metal. The precious metal may be Pt, Au, Pd, Ru, or Ir. The precious metal can serve as a catalyst for oxygen ion generation reaction. Also, when made of such a precious metal, the first and second electrodes are resistant to oxidation.

BRIEF DESCRIPTION OF THE DRAWINGS

FIGS. 2(a) to 2(h) are cross-sectional views for explaining a working principle according to the present invention;

FIGS. 6(a) and 6(b) are tables showing layer specification of a sample element S1 and a sample element S6, respectively;

FIGS. 7(a) and 7(b) are tables showing layer specification of a sample element S2 and a sample element S7, respectively;

FIGS. 8(a) and 8(b) are tables showing layer specification of a sample element S3 and a sample element S8, respectively;

FIGS. 9(a) and 9(b) are tables showing layer specification of a sample element S4 and a sample element S9, respectively;

FIGS. 10(a) and 10(b) are tables showing layer specification of a sample element S5 and a sample element S10, respectively; and FIG. 11 is a table summarizing the investigation result on depthwise oxygen concentration distribution of the sample elements S6 to S10.

BEST MODE FOR CARRYING OUT THE INVENTION

Figure 1:
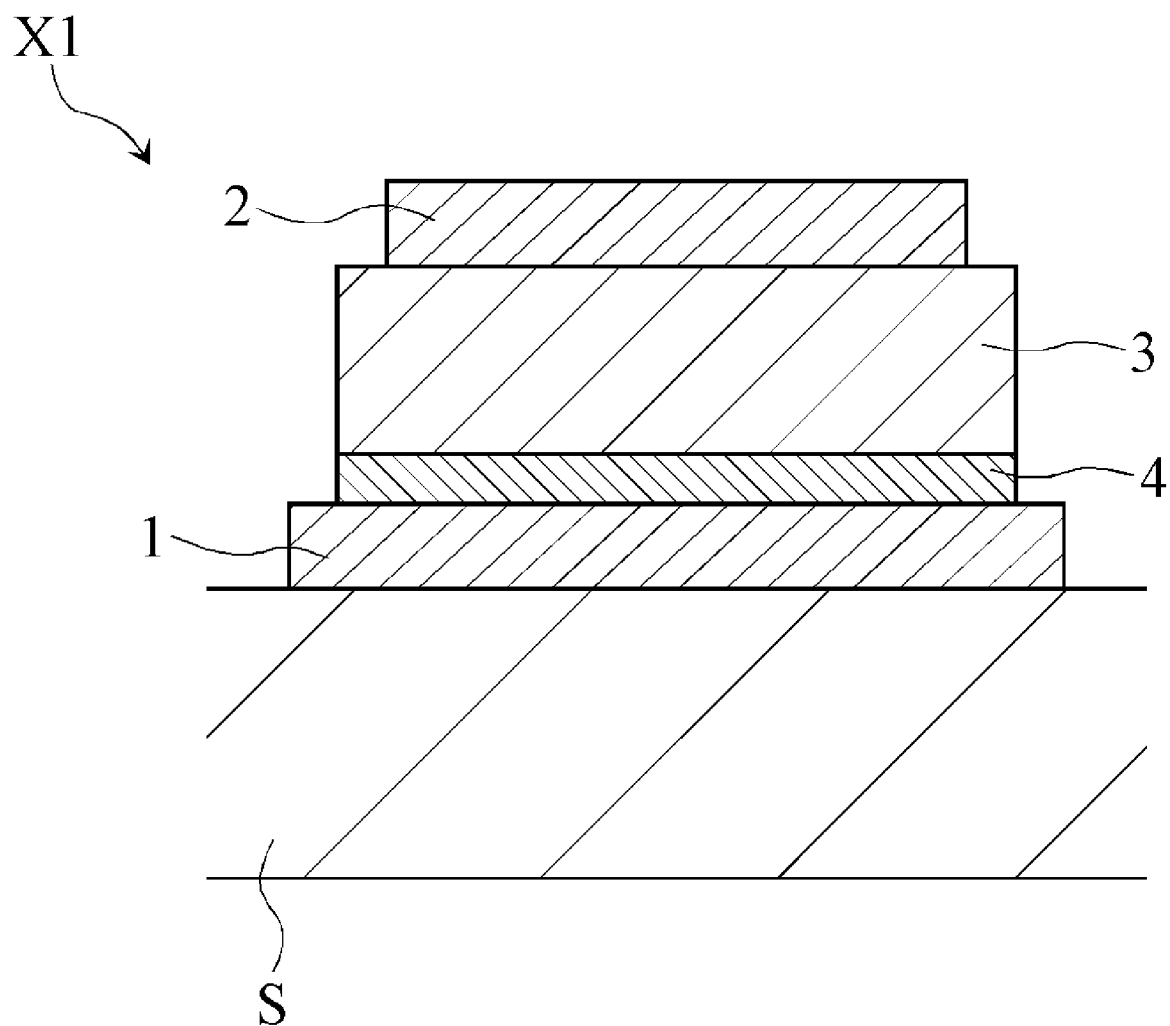
FIG. 1 is a cross-sectional view of a variable-resistance element according to a first embodiment of the present invention.

FIG. 1 is a cross-sectional view of a variable-resistance element X1 according to a first embodiment of the present invention. The variable-resistance element X1 has a multi-layer structure including a substrate S, a pair of electrodes 1, 2, an oxygen ion migration layer 3, and an oxygen ion generation promoting layer (oxygen ion generation promoter) 4, and can be switched between a high resistance state which makes it relatively difficult for a current to pass, and a low resistance state which makes it relatively easy for a current to pass.

The substrate S is for example a silicon substrate or an oxide substrate. A thermally oxidized film may be provided on the surface of the silicon substrate. Examples of the oxide substrate include a MgO substrate, a $SrTiO_3$ substrate, an $Al_2O_3$ substrate, a quartz substrate, and a glass substrate.

The electrodes 1, 2 are each constituted of a highly conductive material, for example a precious metal or a highly conductive oxide. Examples of the precious metal include Pt, Au, Pd, Ru, and Ir. Examples of the highly conductive oxide include $SrRuO_3$, $RuO_2$, $IrO_2$, $SnO_2$, ZnO, and ITO. Each of such electrodes 1, 2 has a thickness of 30 to 200 nm, for example.

The oxygen ion migration layer 3 is located between the electrodes 1, 2, and constitutes the portion to be selectively switched between the high resistance state and the low resistance state. Also, the oxygen ion migration layer 3 is constituted of a solid electrolyte that allows emergence of an oxygen vacancy in response to oxygen ion migration occurring inside. Examples of the solid electrolyte include fluorite-structure type oxide and perovskite-structure type oxide. As the fluorite-structure type oxide, partially-stabilized zirconia ($ZrO_2$) with the addition of Y, Ca, or Mg can be employed, as well as $ZrO_2$ and $Y_2O_3$. As the perovskite-structure type oxide, $SrTiO_3$ or $CaTiO_3$ can be employed. The oxygen ion migration layer 3 has a thickness of, for example, 10 to 50 nm.

Also, the oxygen ion migration layer 3 is constituted of a sufficiently insulative material. Although the oxygen vacancy can be present inside the fluorite-structure type oxide and the perovskite-structure type oxide in a thermodynamical equilibrium state, it is undesirable, from the viewpoint of securing sufficient insulation characteristic of the oxygen ion migration layer 3, that an excessive number of oxygen vacancies is formed in the oxygen ion migration layer 3.

Further, it is preferable that the oxygen ion migration layer 3 is constituted of a crystalline material. A solid electrolyte constituted of a crystalline material generally shows larger oxygen ionic mobility than a solid electrolyte of a non-crystalline material.

The oxygen ion generation promoting layer 4 is a portion that serves to facilitate the generation of the oxygen ion supposed to migrate in the oxygen ion migration layer 3, and is located in contact with the oxygen ion migration layer 3 and between the oxygen ion migration layer 3 or the electrode 2, and the electrode 1. The oxygen ion generation promoting layer 4 is constituted of conductive oxide containing a precious metal capable of acting as a catalyst for the oxygen ion generation reaction. Examples of such precious metal include Pt, Au, Pd, Ru, and Ir. The concentration of the precious metal in the conductive oxide constituting the oxygen ion generation promoting layer 4 is 10 to 50 at %, for example. The oxygen ion generation promoting layer 4 has a thickness of, for example, 1 to 10 nm.

To manufacture the variable-resistance element X1 thus constructed, firstly the electrode 1 is formed on the substrate S. Specifically, a predetermined material is made into a film on the substrate S, and then the film is subjected to an etching process utilizing a predetermined resist pattern as the mask, so as to form the electrode 1 in the pattern on the substrate S. For making the film, for example a sputtering, vacuum deposition, CVD, or laser deposition (LD) can be employed. The oxygen ion generation promoting layer 4, the oxygen ion migration layer 3, and the electrode 2 to be later referred to may also be formed through making a film from the material and patterning by etching similar to the above.

In the case of employing Pt as the material to form the electrode 1, by e.g. the sputtering method utilizing a sputtering device, a Pt film can be formed on the substrate S under the condition of Ar gas (0.5 Pa) as the sputtering gas, a Pt target, DC discharge, power of 1.0 kW to be applied, and the temperature condition in a range between room temperature and 300° C. In the case of employing $SrRuO_3$ as the material to form the electrode 1, by e.g. the sputtering method, a $SrRuO_3$ layer film can be formed on the substrate S under the condition of a gas mixture of Ar and $O_2$ (0.5 Pa, oxygen concentration 10 to 30 vol %) as the sputtering gas, a $SrRuO_3$ target, DC discharge or RF discharge, power of 1.0 kW to be applied, and the temperature condition in a range between room temperature and 500° C.

The next step for manufacturing the variable-resistance element X1 is forming the oxygen ion generation promoting layer 4 on the electrode 1. In the case of employing $Y_2O_3$ containing 20 at % of Pt as the material to form the oxygen ion generation promoting layer 4, by e.g. sputtering method, a $Y_2O_3$ film containing 20 at % of Pt can be formed under the condition of a gas mixture of Ar and $O_2$ (0.5 Pa, oxygen concentration not more than 20 vol %) as the sputtering gas, a $Y_2O_3$ target with five Pt chips (10 mm×10 mm×1 mm) disposed at predetermined positions on its surface, RF discharge, power of 1.0 kW to be applied, and the temperature condition in a range between room temperature and 150° C.

The next step for manufacturing the variable-resistance element X1 is forming the oxygen ion migration layer 3 on the oxygen ion generation promoting layer 4. In the case of employing $ZrO_2$ containing a predetermined minute amount of Y (for example 1 to 10 at %) as the material to form the oxygen ion migration layer 3, by e.g. sputtering method, a Y-added $ZrO_2$ layer can be formed with a condition of a gas mixture of Ar and $O_2$ (0.5 Pa, oxygen concentration 20 to 40 vol %) as the sputtering gas, a Y-added $ZrO_2$ target, RF discharge, power of 1.0 kW to be applied, and the temperature condition in a range between room temperature and 300° C. In this method, employing $O_2$ consisting of oxygen of mass number 18 for the gas mixture enables artificially forming a Y-added $ZrO_2$ film predominantly containing oxygen atoms of mass number 18. On the other hand, in the case of employing $SrTiO_3$ as the material to form the oxygen ion migration layer 3, by e.g. sputtering method, a $SrTiO_3$ film can be formed under a condition of a gas mixture of Ar and $O_2$ (0.5 Pa, oxygen concentration 20 to 40 vol %) as the sputtering gas, a $SrTiO_3$ target, RF discharge, power of 1.0 kW to be applied, and the temperature condition in a range between room temperature and 500° C.

The next step for manufacturing the variable-resistance element X1 is forming the electrode 2 on the oxygen ion migration layer 3. In the case of employing Pt as the material to form the electrode 2, by e.g. sputtering method, a Pt film can be formed under a condition of Ar gas (0.5 Pa) as the sputtering gas, a Pt target, DC discharge, power of 1.0 kW to be applied, and the temperature condition in a range between room temperature and 300° C. In the case of employing $SrRuO_3$ as the material to form the electrode 2, by e.g. sputtering method, a $SrRuO_3$ film can be formed under a condition of a gas mixture of Ar and $O_2$ (0.5 Pa, oxygen concentration 10 to 30 vol %) as the sputtering gas, a $SrRuO_3$ target, DC discharge or RF discharge, power of 1.0 kW to be applied, and the temperature condition in a range between room temperature and 500° C.

By sequentially forming the electrode 1, the oxygen ion generation promoting layer 4, the oxygen ion migration layer 3, and the electrode 2 on the substrate S as described above, the variable-resistance element X1 can be manufactured.

At an initial stage upon manufacturing the variable-resistance element X1, the resistance of the oxygen ion migration layer 3 is significantly high, and hence the variable-resistance element X1 itself has significantly high resistance. The variable-resistance element X1 in such an initial state is subjected to a forming process, as a pre-treatment.

Figure 3:
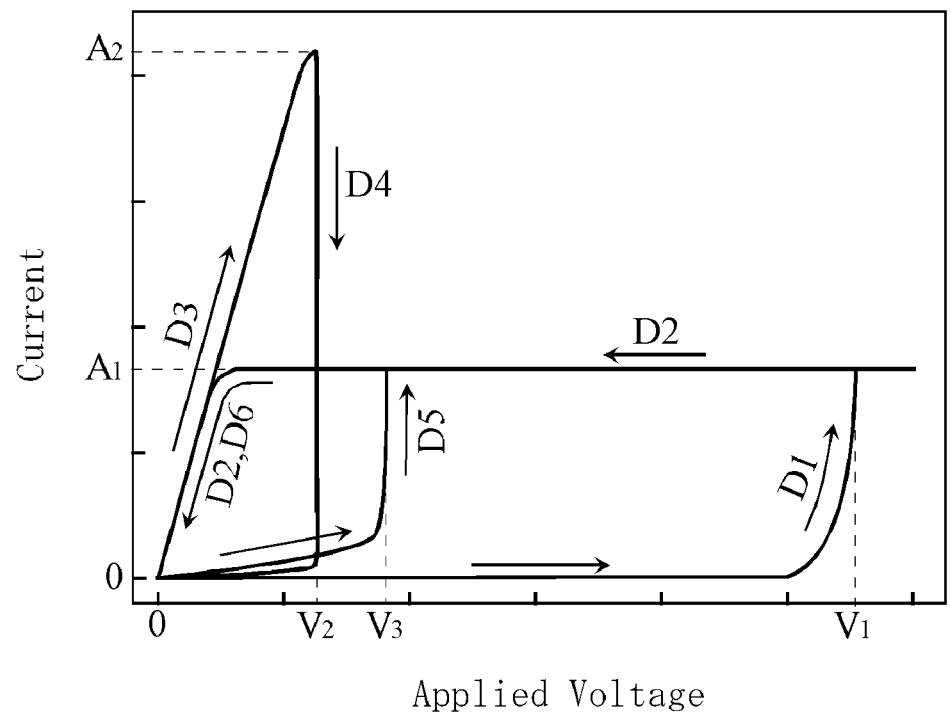
FIG. 3 is a graph showing an example of the current-voltage characteristic of the variable-resistance element according to the present invention.

In the forming process of the variable-resistance element X1, a current limitation is introduced between the electrodes 1, 2 thus to set a predetermined maximum transmittable current A1, and the voltage applied to the electrodes 1, 2, set to act as the negative electrode and the positive electrode, respectively, is increased from e.g. 0 V to a level not lower than a predetermined threshold voltage $V_1$ (threshold voltage $V_1$ varies depending on the material and design size of each part of the element). As a result, the variable-resistance element X1 is switched from the high resistance state to the low resistance state, as represented by the sharp increase in current value indicated by an arrow D1 in FIG. 3, for example. FIG. 3 is a graph showing an example of the current-voltage characteristic of the variable-resistance element X1 according to the present invention. The horizontal axis of the graph in FIG. 3 represents the voltage applied between the electrodes 1, 2 of the variable-resistance element X1, and the vertical axis represents the current passing through the variable-resistance element X1 in a direction from the electrode 1 (negative electrode) to the electrode 2 (positive electrode) (primary carrier in the present element is electron). The value of the maximum transmittable current A1 is determined within a range that does not incur dielectric breakdown in the variable-resistance element X1, or in the oxygen ion migration layer 3.

In this forming process, firstly as shown in FIG. 2(*a*), oxygen ion 5 is generated at the boundary or the neighborhood of the boundary between the oxygen ion generation promoting layer 4 and the oxygen ion migration layer 3 by the catalytic action of the precious metal contained in the oxygen ion generation promoting layer 4.

In the forming process, then as shown in FIGS. 2(*b*) and 2(*c*), the generated oxygen ion 5 carrying negative charge migrates in the oxygen ion migration layer 3 toward the electrode 2 (positive electrode). Accordingly, oxygen vacancies 6 are produced in the oxygen ion migration layer 3, so as to form a row like the trajectory of the oxygen ion migration, thicknesswise of the oxygen ion migration layer 3. When the oxygen ion 5 migrates in the oxygen ion migration layer 3, an oxygen vacancy 6 is newly produced sequentially, at the position where the oxygen ion has passed.

Then as shown in FIG. 2(*d*), an oxygen vacancy chain or a row of oxygen vacancies 6 is formed in the oxygen ion migration layer 3, so as to extend substantially over the entire thickness of the oxygen ion migration layer 3. The oxygen ion 5 which has completed the migration through the oxygen ion migration layer 3 migrates through the boundary between the electrode 2 and the oxygen ion migration layer 3 in a form of an oxygen molecule, and is discharged out of the element. The oxygen vacancy chain has lower resistance than a region in the oxygen ion migration layer 3 where the oxygen vacancy chain is absent, and constitutes a low resistance path 7 penetrating the oxygen ion migration layer 3 thicknesswise thereof. The resistance between the electrodes 1, 2 becomes lower in the case where the low resistance path 7 is present, than in the case where the low resistance path 7 is not formed.

Through the foregoing forming process, the variable-resistance element X1 can be switched from the initial state, where the resistance is significantly high, to the low resistance state achieved by the low resistance path 7 penetrating the oxygen ion migration layer 3 thicknesswise thereof. The resistance between the electrodes 1, 2 of the variable-resistance element X1 in the low resistance state is not higher than 500Ω, for example. Even though the applied voltage is reduced to a value lower than the threshold voltage $V_1$, for example 0 V, the variable-resistance element X1 maintains its low resistance state. In the case of decreasing the applied voltage from the threshold voltage $V_1$ to 0 V, the current changes as indicated by an arrow D2 in FIG. 3, for example.

Figure 4:
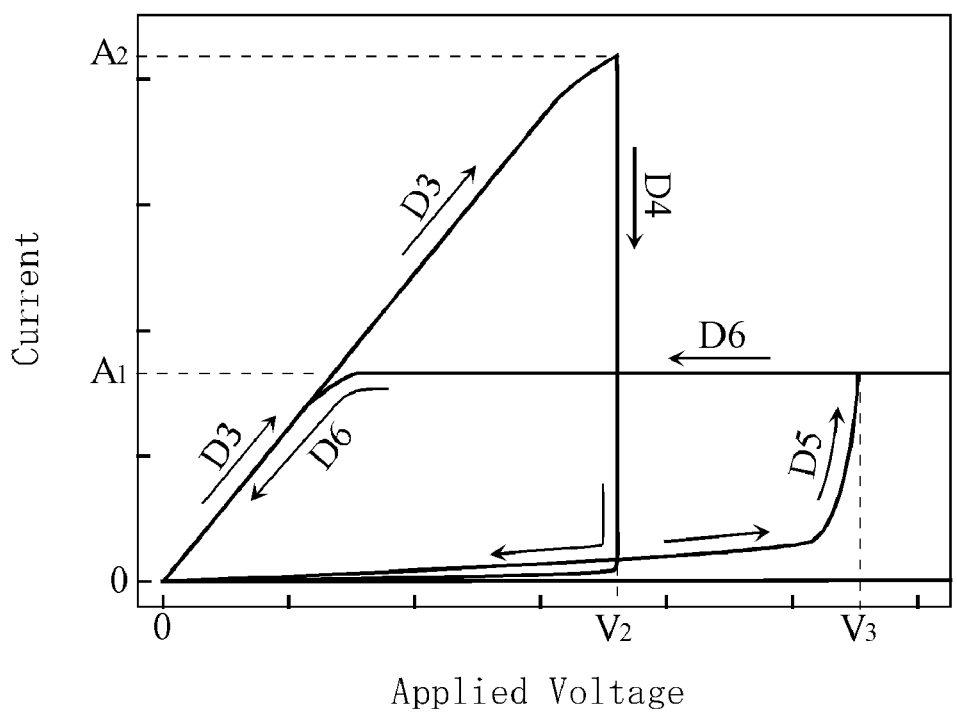
FIG. 4 is a graph showing another example of the current-voltage characteristic of the variable-resistance element according to the present invention, and corresponds to a part of the graph of FIG. 3.

The variable-resistance element X1 in the low resistance state thus achieved can be reset to the high resistance state, by increasing the voltage applied between the electrodes 1, 2, set to act as the negative electrode and the positive electrode, respectively, from e.g. 0 v to a predetermined threshold voltage $V_2$ ($<V_1$) without setting the current limitation between the electrodes 1, 2 (the threshold voltage $V_2$ varies depending on the material and design size of each part of the element). When the applied voltage is gradually increased from 0 V, initially the current passing through the variable-resistance element X1 gradually increases at a relatively large rate as indicated by an arrow D3 in FIGS. 3 and 4, for example. Then, when the applied voltage reaches the threshold voltage $V_2$, the variable-resistance element X1 is switched from the low resistance state to the high resistance state, as represented by the sharp drop in current value as indicated by an arrow D4 in FIGS. 3 and 4. FIG. 4 is a graph showing an example of the current-voltage characteristic of the variable-resistance element according to the present invention, and corresponds to a part of the graph of FIG. 3. The horizontal axis of the graph in FIG. 4 represents the voltage applied between the electrodes 1, 2 of the variable-resistance element X1, and the vertical axis represents the current passing through the variable-resistance element X1 from the electrode 1 (negative electrode) toward the electrode 2 (positive electrode).

In the applied voltage increasing process or resetting process, eventually a current $A_2$ which is larger than the above-mentioned maximum transmittable current $A_2$ can pass in the direction from the electrode 2 (positive electrode) toward the electrode 1 (negative electrode) as shown in FIGS. 3 and 4. The current $A_2$ primarily passes through the low resistance path 7 in the oxygen ion migration layer 3, thereby generating Joule heat. The current then generates, in the resetting process, a sufficient amount of Joule heat in the low resistance path 7 and its vicinity in the oxygen ion migration layer 3, to thereby thermally diffuse the oxygen vacancies 6 so far constituting the low resistance path 7 in the low resistance state, as shown in FIG. 2(*e*). In this process, it is considered that the electric field generated between the electrodes 1, 2 also contributes to the diffusion of the oxygen vacancies 6. As a result, the low resistance path 7 at least loses continuity.

Through such resetting process, the variable-resistance element X1 can be switched from the low resistance state in which the low resistance path 7 penetrating through the oxygen ion migration layer 3 thicknesswise thereof is present, to the high resistance state in which the low resistance path 7 is absent in the oxygen ion migration layer 3. The resistance between the electrodes 1, 2 of the variable-resistance element X1 in the high resistance state is, for example, 100 kΩ or larger. Even when the applied voltage is reduced to a value lower than the threshold voltage $V_2$, for example 0 V, the variable-resistance element X1 maintains its high resistance state.

The variable-resistance element X1 thus switched to the high resistance state through the resetting process can be set to the low resistance state, as represented by the sharp increase in current value as indicated by an arrow D5 in FIGS. 3 and 4, by introducing the current limitation between the electrodes 1, 2 thus setting the maximum transmittable current $A_1$, and increasing the voltage applied between the electrodes 1, 2, set to act as the negative electrode and the positive electrode respectively, for example from 0 v to a predetermined threshold voltage $V_3$ ($V_2<V_3<V_1$), (the threshold voltage $V_3$ varies depending on the material and design size of each part of the element).

In this setting process, firstly as shown in FIG. 2(*f*), oxygen ion 5 is generated at or close to the boundary between the oxygen ion generation promoting layer 4 and the oxygen ion migration layer 3, by the catalytic action of the precious metal contained in the oxygen ion generation promoting layer 4.

In the setting process, then as shown in FIG. 2(*g*), the generated oxygen ion 5 carrying negative charge migrates in the oxygen ion migration layer 3 toward the electrode 2 (positive electrode). Accordingly, oxygen vacancies 6 are produced in the oxygen ion migration layer 3, so as to form a row like the trajectory of the oxygen ion migration, thicknesswise of the oxygen ion migration layer 3. When the oxygen ion 5 migrates in the oxygen ion migration layer 3, the oxygen ion 5 substantially attracts, during the migration, the oxygen vacancy 6 present close to the oxygen ion 5, and keeps migrating by substituting with the oxygen vacancy 6.

Then as shown in FIG. 2(*h*), the low resistance path 7, constituted of the oxygen vacancy chain or the row of oxygen vacancies 6, is again formed in the oxygen ion migration layer 3, so as to extend substantially over the entire thickness of the oxygen ion migration layer 3. The oxygen ion 5 which has completed the migration through the oxygen ion migration layer 3 migrates through the boundary between the electrode 2 and the oxygen ion migration layer 3 in a form of an oxygen molecule, and is discharged out of the element.

Through the foregoing setting process, the variable-resistance element X1 can be switched from the high resistance state to the low resistance state in which the low resistance path 7 penetrating the oxygen ion migration layer 3 thicknesswise thereof is reproduced. Even when the applied voltage is reduced to a value lower than the threshold voltage $V_3$, for example 0 V, the variable-resistance element X1 maintains its low resistance state. In the case of decreasing the applied voltage from the threshold voltage $V_3$ to 0 V, the current changes as indicated by an arrow D6 in FIGS. 3 and 4, for example.

The variable-resistance element X1 thus turned to the low resistance state through the setting process can be again switched to the high resistance state through the foregoing resetting process. In other words, the variable-resistance element X1 can be selectively switched between the high resistance state which makes it relatively difficult for a current to run and the low resistance state which makes it relatively easy for a current to run, by properly undergoing the setting and resetting process. Here, the switching performance is achieved through the unipolar type operation. The variable-resistance element X1 thus configured allows proper recording or rewriting data utilizing the selective switching performance of the resistance state. Accordingly, the variable-resistance element X1 may be utilized as a variable-resistance type non-volatile storage device. The variable-resistance element X1 may also be utilized as a switching element that selectively changes the resistance at a predetermined location in a circuit.

Further, the variable-resistance element X1 is suitable for operating with a low voltage. Since the oxygen ion generation promoting layer 4 is located in contact with the electrode 1 side (negative electrode side) of the oxygen ion migration layer 3 in the variable-resistance element X1, and the oxygen ion generation promoting layer 4 is intended for facilitating the generation of the oxygen ion 5 which is supposed to migrate in the oxygen ion migration layer 3, the oxygen ion generation promoting layer 4 allows reducing the voltage that should be applied between the electrodes 1, 2 for generating the oxygen ion 5.

Thus, the variable-resistance element X1 according to the present invention performs the unipolar type operation, and is suitable for operating with a low voltage.

Figure 5:
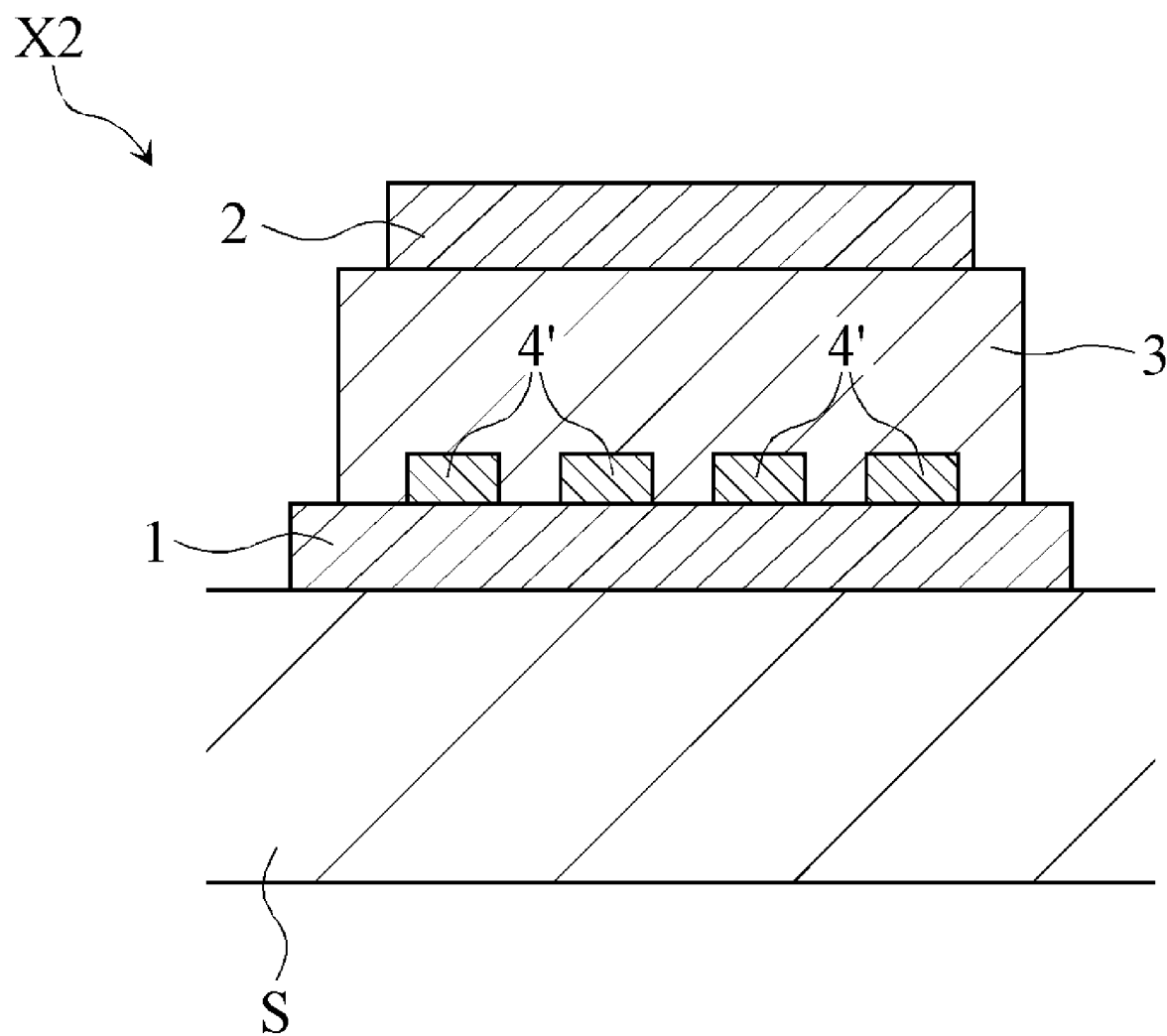
FIG. 5 is a cross-sectional view of a variable-resistance element according to a second embodiment of the present invention.

FIG. 5 is a cross-sectional view of a variable-resistance element X2 according to a second embodiment of the present invention. The variable-resistance element X2 has a multilayer structure including the substrate S, a pair of electrodes 1, 2, and the oxygen ion migration layer 3, and further includes a plurality of oxygen ion generation promoting layers 4'. The variable-resistance element X2 is different from the variable-resistance element X1 according to the first embodiment, in including the plurality of oxygen ion generation promoting layers 4' instead of the oxygen ion generation promoting layer 4.

Each of the oxygen ion generation promoting layers 4' is a portion that serves to facilitate generation of the oxygen ion supposed to migrate in the oxygen ion migration layer 3, and is located in contact with the oxygen ion migration layer 3 and between the oxygen ion migration layer 3 or the electrode 2, and the electrode 1. The oxygen ion generation promoting layer 4' may be constituted of those materials cited above regarding the oxygen ion generation promoting layer 4. Each oxygen ion generation promoting layer 4' has a thickness of, for example, 1 to 10 nm.

The substrate S, the pair of electrodes 1, 2, and the oxygen ion migration layer 3 have the same structure as those described above regarding the variable-resistance element X1.

The variable-resistance element X2 substantially includes the structure of the variable-resistance element X1, and is hence capable of performing the unipolar type operation according to the same working principle as that of the variable-resistance element X1, and suitable for operating with a low voltage.

In addition, the variable-resistance element X2 allows executing what is known as multi-value recording. The variable-resistance element X2 includes a plurality of oxygen ion generation promoting layers 4', each of which is in contact with the electrode 1 side of the oxygen ion migration layer 3, between the electrode 1 (negative electrode) and the electrode 2 (positive electrode). Accordingly, the variable-resistance element X2 enables forming the low resistance path penetrating through the oxygen ion migration layer 3 thicknesswise thereof associated with each of the oxygen ion generation promoting layers 4', thereby forming a plurality of low resistance states of different resistance values, according to the number of low resistance paths 7 to be formed. The variable-resistance element X2 allows, therefore, utilizing the switching performance among a plurality of resistance states of different resistance values, from a highest resistance state under which the oxygen ion migration layer 3 includes not a single low resistance path 7 to a lowest resistance state under which the low resistance paths are formed associated with all of the oxygen ion generation promoting layers 4', and thereby enabling recording or rewriting data in the multi-value mode.

EXAMPLES

Sample Element S1

A variable-resistance element having the layer specification shown in FIG. 6(a) was made up as a sample element S1. The opposing area between the electrodes 1, 2 of the sample element S1 was 31400 μm² (the opposing area between the electrode pair of the sample elements S2 to S10 cited below was also 31400 μm²). The sample element S1 was subjected to the foregoing forming process, and to a plurality of cycles of the resetting process to the high resistance state and the successive setting process to the low resistance state.

In the forming process of the sample element S1, current limitation was introduced between the electrodes 1, 2 and the maximum transmittable current was set at 0.5 mA, and a forming DC voltage of 15 V was applied between the electrodes 1, 2, set to act as the negative electrode and the positive electrode, respectively. Through such forming process, the low resistance path 7 was formed in the oxygen ion migration layer 3 of the sample element S1, and the sample element S1 achieved a predetermined low resistance state.

For resetting the sample element S1 to the high resistance state, a resetting pulse voltage (pulse intensity 1.8 V, pulse width 1 msec.) was applied between the electrodes 1, 2, set to act as the negative electrode and the positive electrode, respectively, without introducing the current limitation between the electrodes 1, 2. In this resetting process, a relatively high resetting current of approximately 10 mA passed through the sample element S1, and the low resistance path 7 was broken by Joule heat generated because of the resetting current in the low resistance path 7 and the vicinity thereof in the oxygen ion migration layer 3, and thus the sample element S1 was switched to the high resistance state.

For setting the sample element S1 to the low resistance state, current limitation was introduced between the electrodes 1, 2 and the maximum transmittable current was set at 0.5 mA, and a setting pulse voltage (pulse intensity 3.5 V, pulse width 50 nsec.) was applied between the electrodes 1, 2, set to act as the negative electrode and the positive electrode, respectively. Through such setting process, the low resistance path 7 was again formed in the oxygen ion migration layer 3 of the sample element S1, and the sample element S1 was switched to the low resistance state.

The sample element S1 could stand one million cycles including the successive process of resetting to the high resistance state and setting to the low resistance state, under the foregoing condition as forming DC voltage of 15 V, resetting pulse voltage of 1.8 V, and setting pulse voltage of 3.5 V.

Sample Element S2

An element having the layer specification shown in FIG. 7(a) was made up as a sample element S2. The sample element S2 was subjected to the foregoing forming process, and then to a plurality of cycles including the successive process of resetting to the high resistance state and setting to the low resistance state, in the same manner as with the sample element S1, except that the forming DC voltage was 20 V instead of 15 V, the resetting pulse voltage was 2.0 V instead of 1.8 V, and the setting pulse voltage was 5.5 V instead of 3.5 V.

Since the sample element S2 includes a $Y_2O_3$ layer which acts as a pseudo oxygen ion generation promoting layer on behalf of the oxygen ion generation promoting layer 4, larger voltages (forming DC voltage 20 V and setting pulse voltage 5.5 V) than those for the sample element S1 had to be applied in order to generate oxygen ion in the sample element S2. Also, the sample element S2 could stand 100,000 cycles, but could not stand more than 300,000 cycles including the successive process of resetting to the high resistance state and setting to the low resistance state, under the condition as forming DC voltage of 20 V, resetting pulse voltage of 2.0 V, and setting pulse voltage of 5.5 V. It is considered that applying larger voltages to the sample element S2 than to the sample element S1 can be a reason why the former could only stand fewer cycles than the latter.

Sample Element S3

An element having the layer specification shown in FIG. 8(a) was made up as a sample element S3. The sample element S3 was subjected to the foregoing forming process, and then to a plurality of cycles including the successive process of resetting to the high resistance state and setting to the low resistance state, in the same manner as with the sample element S1, except that the forming DC voltage was 18 V instead of 15 V, and the setting pulse voltage was 4.8 V instead of 3.5 V.

Since the sample element S3 does not include the oxygen ion generation promoting layer 4 and hence the oxygen ion migration layer 3 and the electrode 1 are in direct contact, higher voltages (forming DC voltage 18 V and setting pulse voltage 4.8 V) than those for the sample element S1 had to be applied in order to generate oxygen ion in the sample element S3. Also, the sample element S3 could stand 300,000 cycles, but could not stand more than 500,000 cycles including the successive process of resetting to the high resistance state and setting to the low resistance state, under the condition as forming DC voltage of 18 V, resetting pulse voltage of 1.8 V, and setting pulse voltage of 4.8 V. It is considered that applying higher voltages to the sample element S3 than to the sample element S1 can be a reason why the former could only stand fewer cycles than the latter.

Sample Element S4

An element having the layer specification shown in FIG. 9(a) was made up as a sample element S4. The sample element S4 was subjected to the foregoing forming process, and then to a plurality of cycles including the successive process of resetting to the high resistance state and setting to the low resistance state, in the same manner as with the sample element S1, except that the forming DC voltage was 25 V instead of 15 V, the resetting pulse voltage was 2.5 V instead of 1.8 V, and the setting pulse voltage was 6.3 V instead of 3.5 V.

Since the oxygen ion migration layer 3 of the sample element S4 is constituted of a non-crystalline material, this oxygen ion migration layer 3 has greater resistance against the oxygen ion migration than that of the sample element S1, which is constituted of a crystalline material. Accordingly, larger voltages (in particular, forming DC voltage 25 V and setting pulse voltage 6.3 V) than those for the sample element S1 had to be applied in order to generate oxygen ion in the sample element S4. Also, the sample element S4 could stand 300,000 cycles, but could not stand more than 500,000 cycles including the successive process of resetting to the high resistance state and setting to the low resistance state, under the condition as forming DC voltage of 25 V, resetting pulse voltage of 2.5 V, and setting pulse voltage of 6.3 V. It is considered that applying higher voltages to the sample element S4 than to the sample element S1 can be a reason why the former could only stand fewer cycles than the latter.

Sample Element S5

An element having the layer specification shown in FIG. 10(a) was made up as a sample element S5. The sample element S5 was subjected to the foregoing forming process, and then to a plurality of cycles including the successive process of resetting to the high resistance state and setting to the low resistance state, in the same manner as with the sample element S1, except that the forming DC voltage was 25 V instead of 15 V, the resetting pulse voltage was 4.3 V instead of 1.8 V, and the setting pulse voltage was 13.5 V instead of 3.5 V. The sample element S5 could stand 30 cycles, but could not stand more than 50 cycles including the successive process of resetting to the high resistance state and setting to the low resistance state, under the condition as forming DC voltage of 25 V, resetting pulse voltage of 4.3 V, and setting pulse voltage of 13.5 V.

The sample element S5 includes an $Al_2O_3$ layer, which is a crystalline layer acting as a pseudo oxygen ion migration layer on behalf of the oxygen ion migration layer 3. The crystalline $Al_2O_3$ is an oxide of a corundum structure, inside which the oxygen ion cannot migrate. Since the oxygen ion is unable to migrate inside the $Al_2O_3$ layer and hence the low resistance path 7 cannot be formed in the $Al_2O_3$ layer, the resistance state in the sample element S5 is switched based on a different working principle from the principle according to the present invention. The sample element S5, in which the resistance state of the oxygen ion migration layer 3 or the element itself is not switched based on the formation and breakdown of the low resistance path 7 in the oxygen ion migration layer 3, can only stand an extremely small number of cycles compared with the sample elements S1 to S4.

Sample Elements S6 to S10

Elements having the layer specification shown in FIGS. 6(b), 7(b), 8(b), 9(b), and 10(b) were made up as sample elements S6 to S10, respectively.

The sample element S6 has the same layer specification as that of the sample element S1, except that a crystalline Y-added $ZrO_2$ layer (artificially made to predominantly contain oxygen of mass number 18) of 5 nm in thickness, and a crystalline Y-added $ZrO_2$ layer (oxygen is of a natural isotopic composition) of 35 nm in thickness are provided for constituting the oxygen ion migration layer 3, in place of a crystalline Y-added $ZrO_2$ layer (oxygen is of a natural isotopic composition) of 40 nm in thickness.

The sample element S7 has the same layer specification as that of the sample element S2, except that a crystalline Y-added $ZrO_2$ layer (artificially made to predominantly contain oxygen of mass number 18) of 5 nm in thickness, and a crystalline Y-added $ZrO_2$ layer (oxygen is of a natural isotopic composition) of 35 nm in thickness are provided for constituting the oxygen ion migration layer 3, in place of a crystalline Y-added $ZrO_2$ layer (oxygen is of a natural isotopic composition) of 40 nm in thickness.

The sample element S8 has the same layer specification as that of the sample element S3, except that a crystalline Y-added $ZrO_2$ layer (artificially made to predominantly contain oxygen of mass number 18) of 5 nm in thickness, and a crystalline Y-added $ZrO_2$ layer (oxygen is of a natural isotopic composition) of 35 nm in thickness are provided for constituting the oxygen ion migration layer 3, in place of a crystalline Y-added $ZrO_2$ layer (oxygen is of a natural isotopic composition) of 40 nm in thickness.

The sample element S9 has the same layer specification as that of the sample element S4, except that a non-crystalline Y-added $ZrO_2$ layer (artificially made to predominantly contain oxygen of mass number 18) of 5 nm in thickness, and a non-crystalline Y-added $ZrO_2$ layer (oxygen is of a natural isotopic composition) of 35 nm in thickness are provided for constituting the oxygen ion migration layer 3, in place of a non-crystalline Y-added $ZrO_2$ layer (oxygen is of a natural isotopic composition) of 40 nm in thickness.

The sample element S10 has the same layer specification as that of the sample element S5, except that a crystalline $Al_2O_3$ layer (artificially made to predominantly contain oxygen of mass number 18) of 5 nm in thickness, and a crystalline Y-added $Al_2O_3$ layer (oxygen is of a natural isotopic composition) of 35 nm in thickness are provided for constituting the pseudo oxygen ion migration layer, in place of a crystalline $Al_2O_3$ layer (oxygen is of a natural isotopic composition) of 40 nm in thickness.

The sample elements S6 to S10 were each subjected to measurement of depthwise concentration distribution (depth profile) of the oxygen of mass number 18 by secondary ion mass spectroscopy (hereinafter, SIMS), prior to applying any type of voltage. To work out the depthwise concentration distribution, the concentration of the oxygen of mass number 18 was measured at the depth of 3 nm, 10 nm, 20 nm, 30 nm, 37 nm, with the reference level set at the boundary between the electrode 2 and the layer located immediately thereunder, and the depth defined as the distance toward the substrate from the reference level. With respect to any of the sample elements S6 to S10 in the initial state, no oxygen of mass number 18 was detected except at the depth of 37 nm. Accordingly, it was proven that in the sample elements S6 to S10 of the initial state the oxygen of mass number 18 did not migrate.

Then each of the sample elements S6 to S10 was subjected to DC voltage application for 60 minutes between the electrodes 1, 2, set to act as the negative electrode and the positive electrode respectively, upon introducing the current limitation between the electrodes 1, 2 thus setting the maximum transmittable current of 0.5 mA. The DC voltage applied to the sample element S6 was 7.5 V, which corresponds to 50% of the forming DC voltage (15 V) applied to the sample element S1. The DC voltage applied to the sample element S7 was 10 V, which corresponds to 50% of the forming DC voltage (20 V) applied to the sample element S2. The DC voltage applied to the sample element S8 was 9 V, which corresponds to 50% of the forming DC voltage (18 V) applied to the sample element S3. The DC voltage applied to the sample element S9 was 12.5 V, which corresponds to 50% of the forming DC voltage (25 V) applied to the sample element S4. The DC voltage applied to the sample element S10 was 12.5 V, which corresponds to 50% of the forming DC voltage (25 V) applied to the sample element S5.

After applying those lower voltages, each of the sample element S6 to S10 was again subjected to measurement of depthwise concentration distribution of the oxygen of mass number 18 by SIMS. This time also, the concentration of the oxygen of mass number 18 was measured at the depth of 3 nm, 10 nm, 20 nm, 30 nm, 37 nm, with the reference level set at the boundary between the electrode 2 and the layer located immediately thereunder, and the depth defined as the distance toward the substrate from the reference level. The result is shown in the table of FIG. 11. The circle in the table of FIG. 11 represents the case where the oxygen of mass number 18 was detected, and the cross represents the contrary case.

In the sample elements S6, S9, the oxygen of mass number 18 was detected at all the depth points involved in the measurement (in other words, generally throughout the entire thickness of the oxygen ion migration layer 3). Such result implies the following fact. In the sample elements S6, S9 under the DC voltage application, oxygen ion was generated at the boundary or in the vicinity thereof between the oxygen ion generation promoting layer 4 and the oxygen ion migration layer 3, and the oxygen ion migrated in the oxygen ion migration layer 3 toward the electrode 2 (positive electrode) because of the effect of the electrical field, and the migration performance was active.

In the sample elements S8, although the oxygen of mass number 18 was detected at the depth of 20 nm and 30 nm in addition to 37 nm, but not at the depth of 3 nm and 10 nm. Such result implies the following fact. In the sample element S8 under the DC voltage application, oxygen ion was generated at the boundary or in the vicinity thereof between the oxygen ion migration layer 3 and the electrode 1 (negative electrode), and although the oxygen ion migrated in the oxygen ion migration layer 3 toward the electrode 2 (positive electrode) because of the effect of the electrical field, the migration performance was inactive.

The generation of the oxygen ion in the sample element S8 originated from the catalytic effect of Pt, contained in the electrode 1 located in contact with the oxygen ion migration layer 3. The inactive migration performance is a result of low generation efficiency of the oxygen ion due to the absence of the oxygen ion generation promoting layer 4. The oxygen ion generation promoting layer 4, which is an electroconductive oxide containing a precious metal, substantially includes a significantly large surface area of the precious metal, and hence bears therein a large number of catalytic reaction sites, however the sample element S8 is not provided with such oxygen ion generation promoting layer 4.

In the sample element S7, the oxygen of mass number 18 was not detected at any depth except 37 nm (in other words, the oxygen ion migration was not observed in the oxygen ion migration layer 3). The fact that the oxygen ion migration was not observed in the oxygen ion migration layer 3, where the oxygen ion could have migrated because of the effect of the electrical field, implies that the oxygen ion was not generated in the sample element S7 under the DC voltage application.

In the sample element S10 either, the oxygen of mass number 18 was not detected at any depth except 37 nm (in other words, the oxygen ion migration was not observed in the pseudo oxygen ion migration layer). The fact that the oxygen ion migration was not observed in the $Al_2O_3$ layer despite the presence of the oxygen ion generation promoting layer 4, which exhibits significantly high catalytic ability, implies that the oxygen ion did not migrate in the $Al_2O_3$ layer of the sample element S10 under the DC voltage application.

In view of the foregoing, it is to be understood that the presence of the oxygen ion migration layer 3 which permits oxygen ion to migrate therein because of the effect of the electrical field, and of the oxygen ion generation promoting layer 4 located in contact with the electrode 1 side (negative electrode side) of the oxygen ion migration layer 3 efficiently activates and promotes the oxygen ion migration to the desired level.

The invention claimed is:

1. A variable-resistance element having a multilayer structure, the element comprising:
   a first electrode;
   a second electrode;
   an oxygen ion migration layer disposed between the first electrode and the second electrode for providing a low resistance path of oxygen vacancy resulting from oxygen ion migration within the oxygen ion migration layer; and
   an oxygen ion generation promoter, containing a conductive oxide, disposed between the oxygen ion migration layer and the first electrode and held in contact with the oxygen ion migration layer;
   wherein the conductive oxide includes a metal capable of acting as a catalyst for an oxygen ion generation reaction.

2. The variable-resistance element according to claim 1, wherein the oxygen ion generation promoter comprises a plurality of oxygen ion generation promoting layers.

3. The variable-resistance element according to claim 1, wherein the oxygen ion migration layer is selectively brought into one of a low resistance state and a high resistance state, the low resistance path extending through the oxygen ion migration layer thicknesswise thereof in the low resistance state, while being inhibited from extending through the oxygen ion migration layer thicknesswise thereof in the high resistance state.

4. The variable-resistance element according to claim 1, wherein the oxygen ion migration layer is made of a solid electrolyte.

5. The variable-resistance element according to claim 1, wherein the oxygen ion migration layer is made of one of a fluorite-structure type oxide and a perovskite-structure type oxide.

6. The variable-resistance element according to claim 5, wherein the fluorite-structure type oxide comprises partially-stabilized zirconia.

7. The variable-resistance element according to claim 5, wherein the oxygen ion migration layer is made of $ZrO_2$, or $Y_2O_3$, or $SrTiO_3$, or $CaTiO_3$, or $ZrO_2$ containing one of Y, Ca and Mg.

8. The variable-resistance element according to claim 1, wherein the oxygen ion migration layer is made of a crystalline material.

9. The variable-resistance element according to claim 1, wherein the oxygen ion generation promoter is made of an electroconductive oxide containing a precious metal.

10. The variable-resistance element according to claim 1, wherein at least one of the first electrode and the second electrode is made of a precious metal.

* * * * *